United States Patent
Tziviskos et al.

(10) Patent No.: US 9,011,176 B2
(45) Date of Patent: Apr. 21, 2015

(54) ESD PATH FOR CONNECTOR RECEPTACLE

(75) Inventors: George Tziviskos, Cupertino, CA (US); Zheng Gao, San Jose, CA (US)

(73) Assignee: Apple Inc., Cupertino, CA (US)

(*) Notice: Subject to any disclaimer, the term of this patent is extended or adjusted under 35 U.S.C. 154(b) by 254 days.

(21) Appl. No.: 13/492,813

(22) Filed: Jun. 9, 2012

(65) Prior Publication Data
US 2013/0329324 A1    Dec. 12, 2013

(51) Int. Cl.
| H01R 13/648 | (2006.01) |
| H01R 12/50 | (2011.01) |
| H01R 13/658 | (2011.01) |

(52) U.S. Cl.
CPC ...... *H01R 23/6873* (2013.01); *H01R 13/65802* (2013.01)

(58) Field of Classification Search
CPC ........... H01R 23/6873; H01R 23/7073; H01R 13/65802; H01R 13/658
USPC .......................................... 439/607.35–607.4
See application file for complete search history.

(56) References Cited

U.S. PATENT DOCUMENTS

| 5,376,909 | A  | * | 12/1994 | Nelson et al. ................. 333/247 |
| 6,431,906 | B1 | * | 8/2002  | Belopolsky .................... 439/490 |
| 6,524,134 | B2 | * | 2/2003  | Flickinger et al. ......... 439/607.2 |
| 6,945,824 | B1 |   | 9/2005  | Li et al. |
| 7,018,242 | B2 | * | 3/2006  | Brown et al. ................. 439/676 |
| 7,210,945 | B1 |   | 5/2007  | Ying |
| 7,273,390 | B2 | * | 9/2007  | Iida et al. ..................... 439/494 |
| 7,559,805 | B1 |   | 7/2009  | Yi et al. |
| 7,654,866 | B2 |   | 2/2010  | He et al. |
| 7,699,663 | B1 |   | 4/2010  | Little et al. |
| 7,722,407 | B2 |   | 5/2010  | Momose |
| 7,727,026 | B2 |   | 6/2010  | Qin et al. |
| 7,748,999 | B1 |   | 7/2010  | Sun et al. |
| 7,794,284 | B1 | * | 9/2010  | He et al. ....................... 439/660 |
| 7,806,735 | B1 |   | 10/2010 | Chen et al. |
| 7,850,465 | B1 | * | 12/2010 | Wan et al. ....................... 439/79 |
| 7,878,847 | B2 |   | 2/2011  | He et al. |
| 7,959,450 | B1 |   | 6/2011  | Wang et al. |
| 7,988,495 | B2 |   | 8/2011  | Chung |
| 8,021,188 | B1 |   | 9/2011  | Ma et al. |
| 8,025,532 | B2 | * | 9/2011  | Nagata et al. ............... 439/607.4 |

(Continued)

FOREIGN PATENT DOCUMENTS

CN    201355727 Y    12/2009

OTHER PUBLICATIONS

Non-Final Office Action mailed on Dec. 19, 2013 for U.S. Appl. No. 13/419,904, 6 pages.

(Continued)

*Primary Examiner* — Abdullah Riyami
*Assistant Examiner* — Vladimir Imas
(74) *Attorney, Agent, or Firm* — Kilpatrick Townsend & Stockton LLP (57) ABSTRACT

Circuits, methods, and apparatus that may provide a separation between a signal ground and an enclosure ground such that EMI and ESD circuits are not bypassed. One example may provide a connector receptacle having fingers for contacting a device enclosure, where the fingers are not directly electrically connected to a shell of the connector receptacle. These fingers may be isolated from the shell along a top-side by an electrically insulating layer. These fingers may be further insulated from the shell along a back side by a nonconductive piece or portion of a housing.

26 Claims, 7 Drawing Sheets

(56) References Cited

U.S. PATENT DOCUMENTS

| | | |
|---|---|---|
| 8,033,868 B2 | 10/2011 | Wang et al. |
| 8,052,431 B1 | 11/2011 | He et al. |
| 8,079,851 B1 | 12/2011 | Ma |
| 8,147,276 B2 | 4/2012 | Wang et al. |
| 8,162,671 B2 | 4/2012 | Matsubara et al. |
| 8,215,989 B2 * | 7/2012 | Tamm et al. .............. 439/607.01 |
| 8,303,329 B2 * | 11/2012 | Wu ................................ 439/395 |
| 8,408,940 B2 | 4/2013 | Chang |
| 8,419,473 B1 | 4/2013 | Lan et al. |
| 8,439,576 B2 * | 5/2013 | Hsiao et al. ...................... 385/53 |
| 8,439,691 B1 | 5/2013 | Lan et al. |
| 8,475,218 B2 * | 7/2013 | Zheng et al. .................. 439/660 |
| 8,480,435 B2 | 7/2013 | Hsiao et al. |
| 8,480,436 B2 | 7/2013 | Chang |
| 8,545,273 B1 * | 10/2013 | Chen ............................. 439/660 |
| 8,574,011 B2 | 11/2013 | Shih |
| 8,602,825 B2 | 12/2013 | Chen |
| 8,641,454 B2 | 2/2014 | Chen et al. |
| 8,690,608 B2 | 4/2014 | Naito et al. |
| 8,702,452 B2 | 4/2014 | Tai et al. |
| 8,721,361 B2 | 5/2014 | Wu |
| 8,764,492 B2 | 7/2014 | Chiang |
| 2003/0194908 A1 * | 10/2003 | Brown et al. .................. 439/620 |
| 2005/0113889 A1 * | 5/2005 | Jimenez et al. ................. 607/61 |
| 2005/0181643 A1 * | 8/2005 | Brower et al. ............... 439/76.1 |
| 2005/0255745 A1 * | 11/2005 | Walker et al. ............... 439/541.5 |
| 2006/0091006 A1 * | 5/2006 | Wang et al. .............. 204/403.02 |
| 2008/0311801 A1 * | 12/2008 | Chen et al. .................. 439/733.1 |
| 2010/0055986 A1 | 3/2010 | Wang et al. |
| 2010/0227509 A1 | 9/2010 | He et al. |
| 2010/0253538 A1 * | 10/2010 | Smith ....................... 340/870.02 |
| 2011/0021043 A1 * | 1/2011 | Lee ................................. 439/78 |
| 2011/0040246 A1 * | 2/2011 | Galasso .......................... 604/66 |
| 2011/0081022 A1 * | 4/2011 | Tamm et al. ....................... 381/1 |
| 2011/0256764 A1 * | 10/2011 | Wu .......................... 439/607.01 |
| 2011/0269322 A1 | 11/2011 | He et al. |
| 2011/0269341 A1 | 11/2011 | He et al. |
| 2011/0294339 A1 * | 12/2011 | Wu ................................ 439/391 |
| 2012/0020624 A1 * | 1/2012 | Liao et al. ......................... 385/77 |
| 2012/0077390 A1 | 3/2012 | Tsai |
| 2012/0083164 A1 * | 4/2012 | Gao et al. ...................... 439/630 |
| 2013/0040470 A1 * | 2/2013 | Gao et al. ........................ 439/39 |
| 2013/0244494 A1 | 9/2013 | Tziviskos et al. |
| 2013/0288537 A1 | 10/2013 | Simmel et al. |
| 2013/0316592 A1 | 11/2013 | Yu et al. |
| 2014/0045352 A1 | 2/2014 | Weber et al. |

OTHER PUBLICATIONS

International Search Report and Written Opinion mailed on Jun. 6, 2013 for PCT Patent Application No. PCT/US2013/031686, 12 pages.

Non-Final Office Action mailed on May 1, 2014 for U.S. Appl. No. 13/419,904, 6 pages.

Notice of Allowance mailed on Aug. 27, 2014 for U.S. Appl. No. 13/419,904, 7 pages.

* cited by examiner

ESD PATH FOR CONNECTOR RECEPTACLE

BACKGROUND

The number and types of electronic devices available to consumers have increased tremendously the past few years, and this increase shows no signs of abating. Devices such as portable computing devices, tablet, desktop, and all-in-one computers, cell, smart, and media phones, storage devices, portable media players, navigation systems, monitors and other devices have become ubiquitous.

These devices often receive power and share data using various cables. These cables may have connector inserts, or plugs, on each end. The connector inserts may plug into connector receptacles on electronic devices, thereby forming one or more conductive paths for signals, power, and ground.

These signals are voltages that may vary relative to a ground line. The ground line may be referred to as signal ground. One or more signal grounds may be conveyed in a cable along with signals and supply voltages.

These signal grounds may become noisy. For example, frequency components from signals carried in the cable may corrupt the signal ground. Reflections caused by mismatched terminations may also degrade the quality of the ground. Also, signals outside the cable may send frequency components that are carried by the signal ground.

Enclosures or cases for electronic devices are often connected to ground. If a noisy signal ground connects to the device enclosure, the noise from the signal ground may radiate throughout the device, thereby degrading device performance.

To prevent this, circuitry to suppress electromagnetic interference (EMI) may be placed between a signal ground and an enclosure ground. But this circuitry may be bypassed if a signal ground is directly connected to the device enclosure.

Thus, what is needed are circuits, methods, and apparatus that may provide a separation between a signal ground and an enclosure ground such that EMI circuits are not bypassed.

SUMMARY

Accordingly, embodiments of the present invention may provide circuits, methods, and apparatus that may provide a separation between a signal ground and an enclosure ground such that EMI circuits are not bypassed or shorted out.

An illustrative embodiment of the present invention may provide a connector receptacle having fingers for contacting a device enclosure, where the fingers are not directly electrically connected to a shell of the connector receptacle. In a specific embodiment of the present invention, these fingers are isolated from the shell along a top-side by an electrically insulating layer. This layer may be formed of a tape, such as polyimide tape, which may also be referred to as Kapton® tape, or more commonly, electrical tape. These fingers may be further insulated from the shell along a back side by a nonconductive piece or portion of a housing. This piece or housing portion may be formed of plastic, nylon, or other nonconductive material.

Another illustrative embodiment of the present invention may provide a connector receptacle having a faceplate that mates with a corresponding attraction plate on a connector insert. The attraction plate and faceplate may form part of an electrical path for a signal ground. The faceplate may electrically connect to a remaining portion of a shell of the connector receptacle. The shell may then electrically connect to a signal ground connection on a main-logic or other board. This board may be a printed circuit board, flexible circuit board, or other appropriate substrate.

The connector receptacle may further include fingers to make electrical contact with a device enclosure. These fingers may be electrically isolated from the shell of the connector receptacle. Again, these fingers are isolated from the shell along a top-side by an electrically insulating layer, which may be formed of tape or other electrically insulative material. These fingers may be further insulated from the shell along a back side by a nonconductive piece or portion of a housing, which may be formed of plastic or other electrically insulative material. These fingers may then electrically connect to an enclosure ground connection on the main-logic or other board. EMI circuits may then be placed between the signal ground and the enclosure ground. Electrostatic discharge (ESD) circuits, such as a spark-gap, Zener diode, or other ESD circuit may also be located between the signal ground and enclosure ground.

In various embodiments of the present invention, the connector receptacle may include one or more ground contacts. These ground contacts may be electrically connected to the signal ground of the faceplate and shell, or they may be connected to other grounds.

In various embodiments of the present invention, different materials may be used for portions of the connector receptacle. For example, the fingers may be formed using a highly conductive material, such as phosphor bronze or other material. The faceplate of the receptacle may be formed of a ferromagnetic steel, other magnetically conductive material, or other electrically conductive material. The remaining portion of the shell may be formed of non-magnetically conductive steel. In a specific embodiment of the present invention, label 1210 may be low-carbon steel, such as 10-10 steel. These portions may be plated with nickel, and then plated with platinum nickel.

Embodiments of the present invention may provide connector receptacles consistent with various standard and proprietary communication interfaces. For example, embodiments of the present invention may provide connector receptacles consistent with Universal Serial Bus (USB), High-Definition Multimedia Interface (HDMI), Digital Visual Interface (DVI), DisplayPort, Thunderbolt, and other types of interfaces.

Embodiments of the present invention may provide connector receptacles for use in many types of devices. For example, connector receptacles consistent with embodiments of the present invention may be employed in portable computing devices, tablet, desktop, and all-in-one computers, cell, smart, and media phones, storage devices, portable media players, navigation systems, monitors, and other devices.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Figure 1:
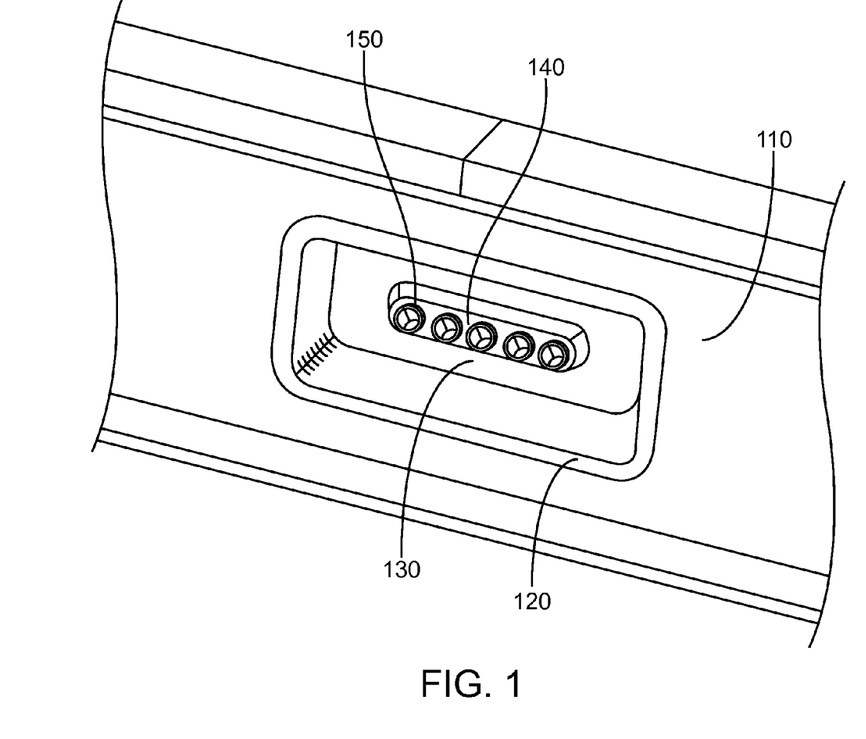
FIG. 1 illustrates a portion of an electronic device that may be improved by the incorporation of an embodiment of the present invention.

FIG. 1 illustrates a portion of an electronic device that may be improved by the incorporation of an embodiment of the present invention. This figure, as with the other included figures is shown for illustrative purposes and does not limit either the possible embodiments of the present invention or the claims.

This example illustrates a portion of a device having an enclosure or case 110. Enclosure or case 110 may have an opening for a connector receptacle 120. Connector receptacle 120 may include faceplate 130. Mesa 140 may extend from faceplate 130 and may include a number of contacts 150.

In a specific embodiment of the present invention, one or more contacts 150 may be ground contacts. Also, faceplate 130 and device enclosure 110 may be grounded as well. In such an embodiment, faceplate 130 and one or more contacts 150 may be signal grounds. These signal grounds may be connected together.

In this example, connector receptacle 120 may be a magnetic connector receptacle, specifically a MagSafe connector receptacle. Other embodiments of the present invention may provide connector receptacles consistent with various standard and proprietary communication interfaces. For example, embodiments of the present invention may provide connector receptacles consistent with Universal Serial Bus (USB), High-Definition Multimedia Interface (HDMI), Digital Visual Interface (DVI), DisplayPort, Thunderbolt, and other types of interfaces.

Embodiments of the present invention may provide connector receptacles for use in many types of devices. For example, connector receptacles consistent with embodiments of the present invention may be employed in portable computing devices, tablet, desktop, and all-in-one computers, cell, smart, and media phones, storage devices, portable media players, navigation systems, monitors, and other devices.

Again, these signal grounds may become corrupted by various sources. For example, the power supply providing power and signal ground may be generated by a noisy power supply source. Also, other signals received or transmitted at connector receptacle 120 may corrupt the signal grounds. Signals not associated with connector receptacle 120 may transmit frequency components that are received by the signal grounds. These various signals may be improperly terminated, thereby causing reflections which may also couple to and cropped the signal grounds. If these noisy signal grounds are coupled directly to device enclosure 110, they may propagate through device enclosure 110 and radiate onto other circuits inside or associated with the electronic device.

Accordingly, embodiments of the present invention may provide connector receptacles that isolate signal grounds on contacts 150 and faceplate 130 from enclosure ground 110. By isolating these ground lines, EMI suppression and ESD circuits may be provided between these ground lines. The EMI suppression circuits may protect noise on a signal grounds from coupling to a device enclosure. The ESD circuits may help prevent electrostatic discharges at connector receptacle 120 from damaging circuitry inside device enclosure 110. An electrical diagram of illustrative circuitry is shown in the following figure.

Figure 2:
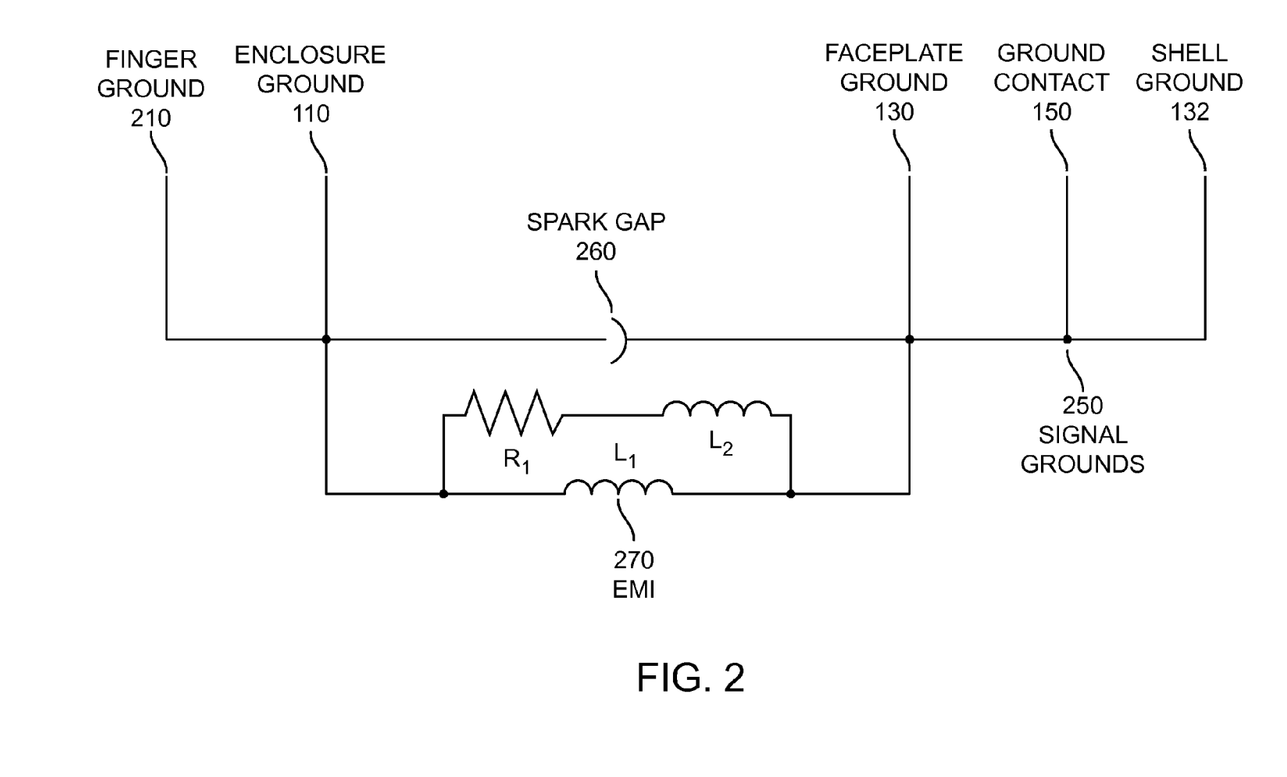
FIG. 2 illustrates an electrical diagram for ground connections for a connector receptacle according to an embodiment of the present invention.

FIG. 2 illustrates an electrical diagram for ground connections for a connector receptacle according to an embodiment of the present invention. Again, a faceplate ground 130 may connect to one of ground contacts 150. Shell ground 132 for the receptacle may also connect to the faceplate ground 130 and ground contact 150. These grounds may be referred to as signal grounds 250.

A finger ground provided by a finger, which is shown below, may connect to enclosure ground 110. Again, EMI and ESD circuits 260 and 270 may be electrically located between signal grounds 250 and the enclosure ground 110. In this case, a spark gap may be used for ESD protection. Examples of spark gaps that may be used may be found in co-pending U.S. patent application Ser. No. 13/033,542, filed Feb. 23, 2011, titled SPARK GAP FOR HIGH-SPEED CABLE CONNECTORS, which is incorporated by reference. Other ESD circuits 260 may be used consistent with embodiments of the present invention, including diodes, Zener diodes, resistors, and other circuits and components. Circuitry shown for EMI circuits 270 are merely illustrative, other circuitry may be used. Electrostatic discharges at a ground contact 150 or faceplate 130 may be dissipated to enclosure ground 110 through spark gap 260. Noise on signal grounds 250 may be suppressed by EMI circuits 270 before they reach enclosure ground 110.

Figure 3:
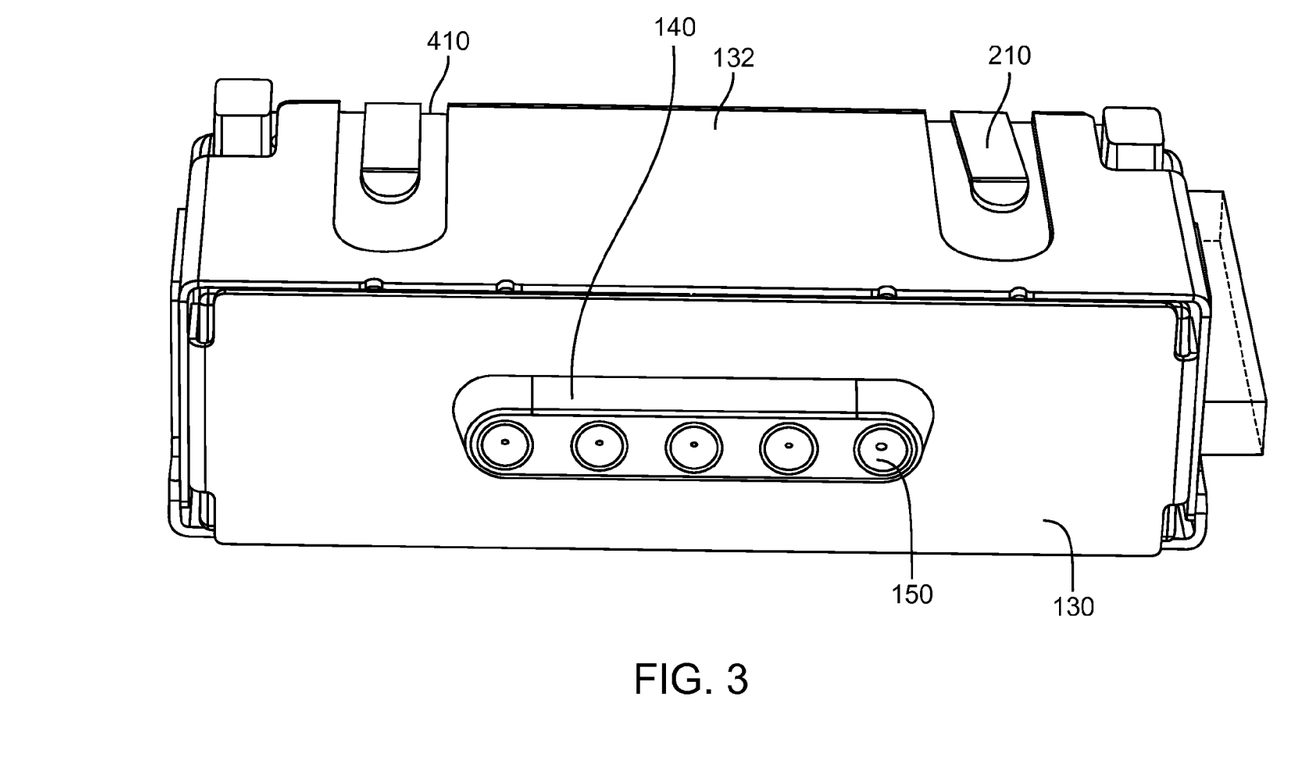
FIG. 3 illustrates a connector receptacle according to an embodiment of the present invention.

In a specific embodiment of the present invention, the receptacle is isolated from the enclosure by a finger that passes through, but does not electrically connect to, the connector receptacle shell. An example is shown in the following figure.

FIG. 3 illustrates a connector receptacle according to an embodiment of the present invention. This connector receptacle includes faceplate 130. Mesa 140 may extend from face plate 130 and may include a number of contacts 150. Shell 132 may connect to faceplate 130. Fingers 210 may be separated from shell 132 by area 410. Area 410 may be covered with an electrically insulating material. In a specific embodiment of the present invention, polyimide or electrical tape may be used. In this way, if finger 210 is pushed down, it does not form an electrical connection with shell 132 or internal structures in the connector receptacle. Again, if finger 210 were to contact shell 132, ESD and EMI components 260 and 270 would be bypassed or shorted out.

In various embodiments of the present invention, these internal structures or components may include magnets, magnetic shunts, contacts, or other components or structures. More detailed examples may be found in co-pending U.S. patent application Ser. No. 13/458,853, filed Apr. 27, 2012, titled MAGNETIC INSERT AND RECEPTACLE FOR CONNECTOR SYSTEM, which is incorporated by reference.

Figure 4:
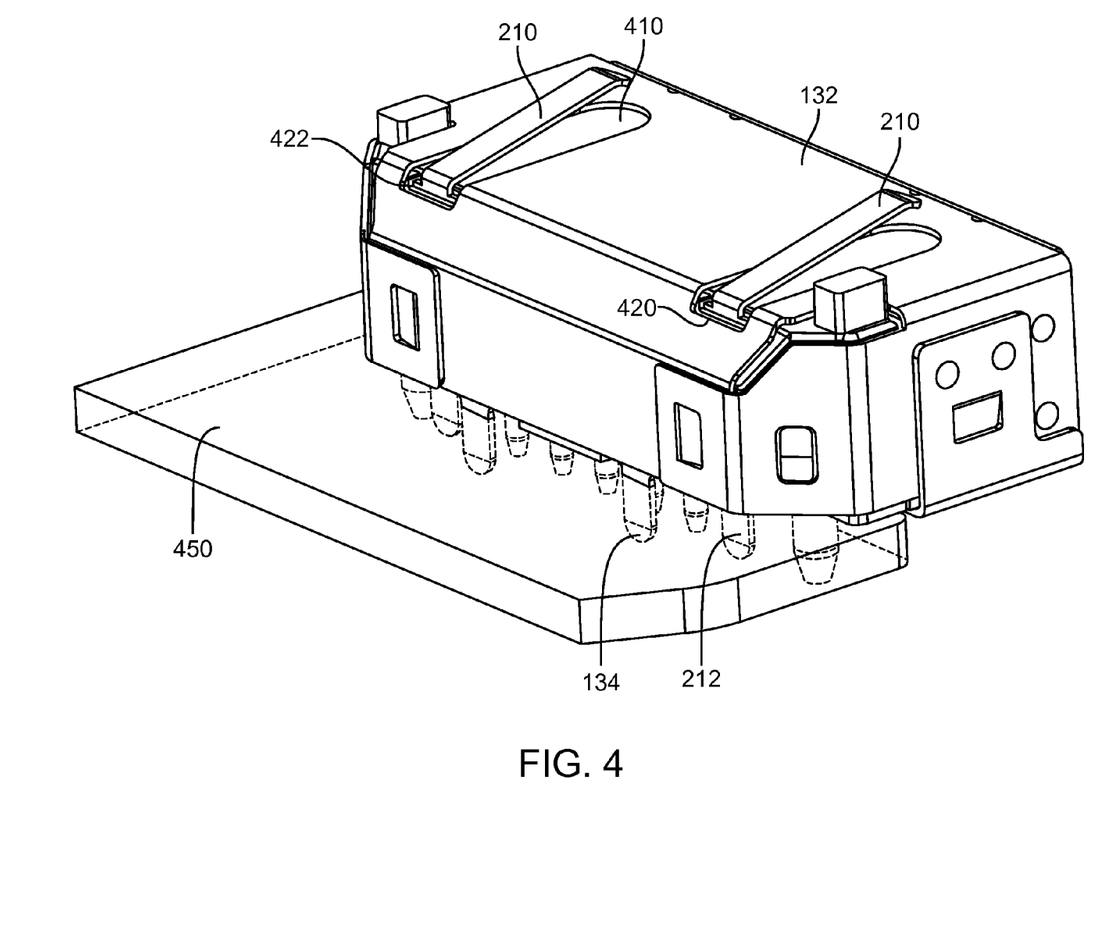
FIG. 4 illustrates a rear view of a connector receptacle according to an embodiment of the present invention.

FIG. 4 illustrates a rear view of a connector receptacle according to an embodiment of the present invention. In this example, the connector receptacle resides on a main-logic board 450. Main-logic board 450 may be a printed circuit board, flexible circuit board, or other appropriate substrate.

Fingers 210 may pass through openings 422 and shell 132 and emerge as tabs 212. Shell 132 may include tabs 132. Fingers 210 may be electrically isolated from shell 132 and internal components of the connector receptacle by tape 410.

Fingers 210 may be further isolated from shell 132 and internal components by plastic piece or housing portion 420.

When located in an electronic device, fingers 210 may contact a surface of device enclosure 110. Fingers 210 may also contacts one or more traces on main-logic board 450 via tab 212, which is the portion of finger 210 extending below the connector receptacle, as shown. Shell 132 may also contact one or more traces on main-logic board 450 via tabs 132.

Figure 5:
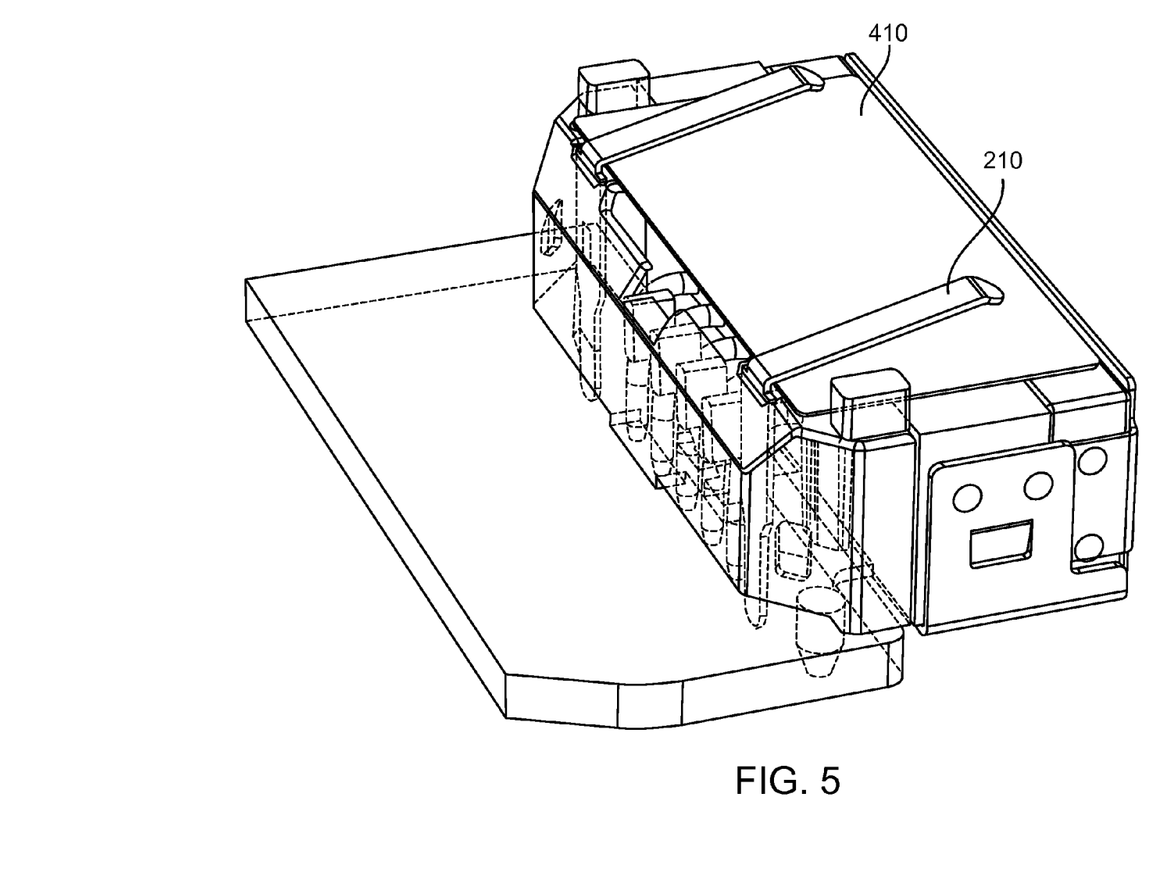
FIG. 5 illustrates a cutaway view of a connector receptacle according to an embodiment of the present invention.

FIG. 5 illustrates a cutaway view of a connector receptacle according to an embodiment of the present invention. In this example, polyimide or electrical tape 410 is shown as covering a substantial portion of a top of the internal components of a connector receptacle. Again, as fingers 210 are depressed, tape 410 may prevent them from coming to contact with structures and components internal to the connector receptacle.

Figure 6:
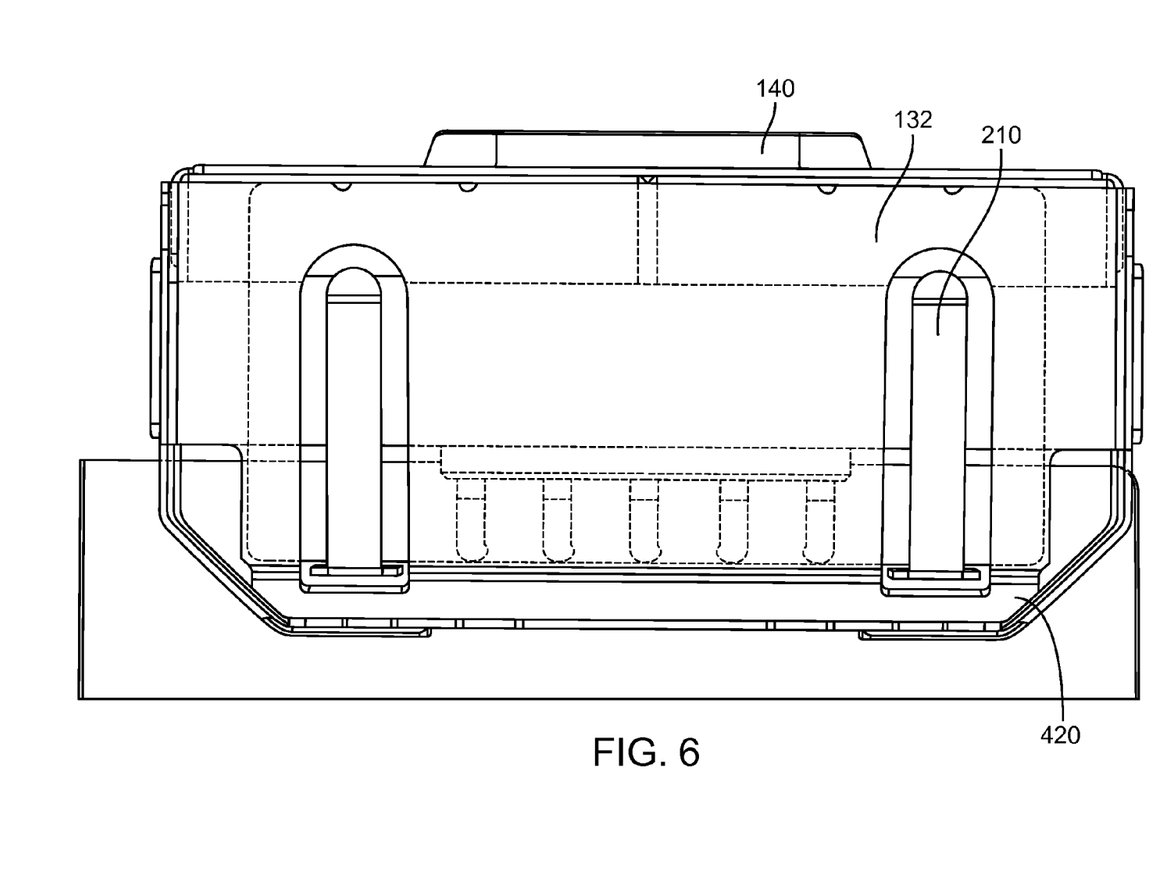
FIG. 6 illustrates a top view of a connector receptacle according to an embodiment of the present invention.

FIG. 6 illustrates a top view of a connector receptacle according to an embodiment of the present invention. Again, fingers 210 may be electrically isolated from shell 132 by housing piece or portion 420. Housing piece or portion 420 may be plastic, nylon, or other electrically nonconductive material.

Figure 7:
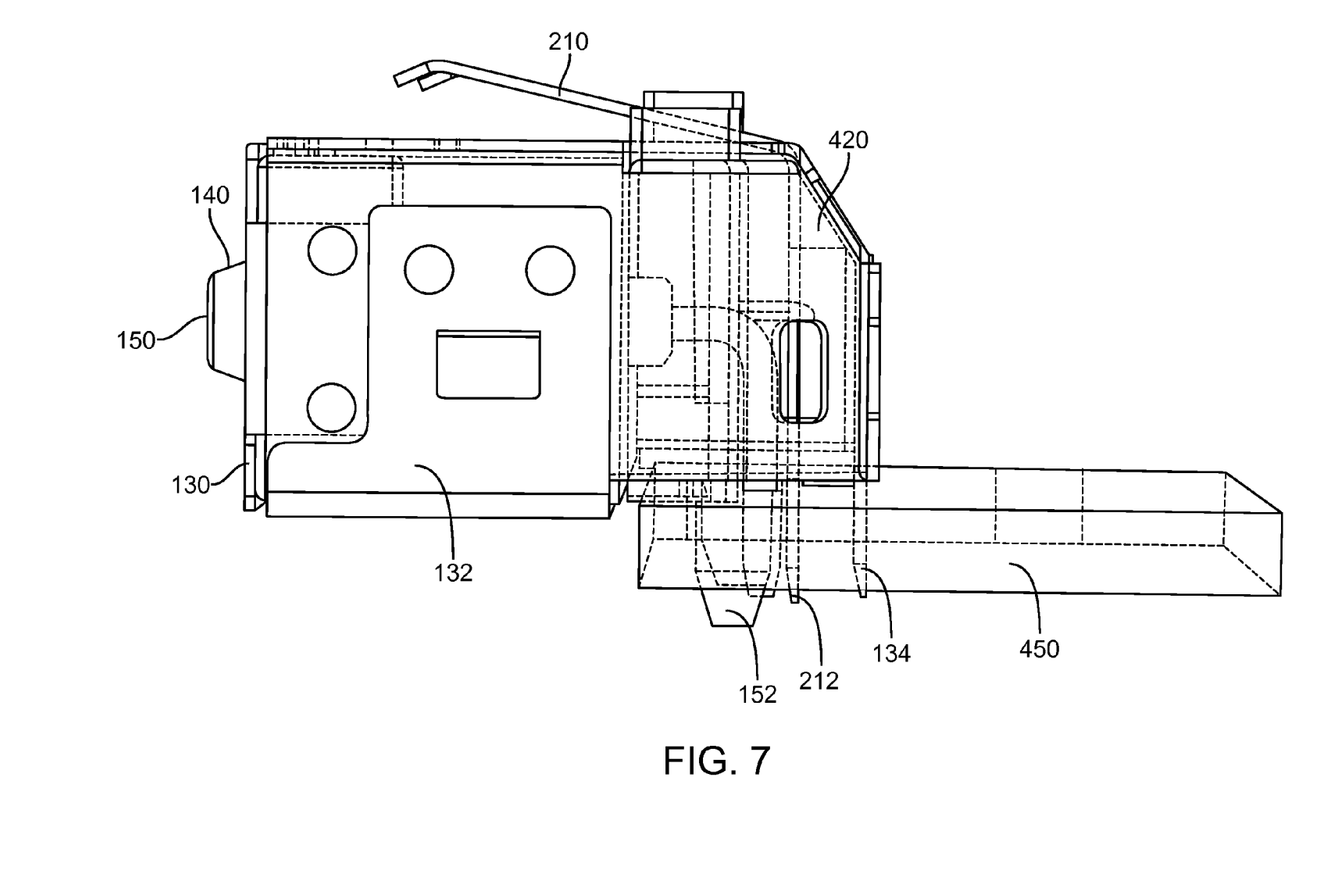
FIG. 7 illustrates a side view of a connector receptacle according to an embodiment of the present invention.

FIG. 7 illustrates a side view of a connector receptacle according to an embodiment of the present invention. Again, fingers 410 are electrically isolated from shell 132 by housing piece or portion 420. Shell 132 may connect to main-logic board 450 via tabs 134. Fingers 210 may electrically connect to main-logic board 450 via tabs 212. Contacts 150 may connect to main-logic board 450 via tabs 152. Again, EMI and ESD components may be electrically connected between traces connected to tabs 212 and 134.

By electrically isolating the signal ground from the enclosure ground, ESD and electrical noise performance may be improved. Specifically, ESD and EMI components 260 and 270 are not shorted out or bypassed. Instead, ESD circuitry 260 may protect electronic device circuitry from electrostatic discharges at the faceplate 130 or ground contacts 132. Also, EMI circuitry 270 may suppress noise on signal grounds 250 and help prevent such noise from reaching the device enclosure 110, from which it would otherwise radiate noise to circuitry in the electronic device.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A connector receptacle comprising:
a shell at least partially surrounding a housing portion;
at least one finger passing through a first opening in a top side of the shell and a second opening in a second side of the shell, the finger electrically insulated from the shell by the housing portion,
wherein the finger is electrically connected to a device enclosure, the device enclosure enclosing an electronic device supporting the connector receptacle and a first trace on a printed circuit board to form an enclosure ground, and
wherein the shell is electrically connected to a second trace on the printed circuit board to form a signal ground, the signal ground and the enclosure ground electrically isolated from each other.

2. The connector receptacle of claim 1 wherein the at least one finger is electrically insulated from the shell by passing through a backside of the housing portion.

3. The connector receptacle of claim 2 wherein the at least one finger is electrically insulated along a topside of the shell by a layer of tape.

4. The connector receptacle of claim 3 wherein the tape is polyimide tape.

5. The connector receptacle of claim 3 wherein the at least one finger is formed of phosphor bronze.

6. The connector receptacle of claim 5 wherein the shell is formed using stainless steel.

7. The connector receptacle of claim 3 wherein the shell and the at least one finger are soldered to a main-logic board.

8. The connector receptacle of claim 7 wherein electromagnetic interference suppression circuits are electrically located between the shell and the at least one finger.

9. An electronic device comprising:
an enclosure having an opening;
a receptacle located in the opening, the receptacle comprising:
a shell at least partially surrounding a housing portion and having a first tab; and
at least one finger passing through a first opening in a top of the shell and a second opening in a second side of the shell, the finger electrically insulated from the shell by the housing portion, the finger electrically connected to the enclosure; and
a main logic board having a signal ground path electrically connected to the first tab of the shell and an enclosure ground path electrically connected to the device enclosure and the at least one finger, the signal ground and the enclosure ground electrically isolated from each other.

10. The electronic device of claim 9 wherein the at least one finger is electrically insulated from the shell by passing through a backside of the housing portion.

11. The electronic device of claim 10 wherein the at least one finger is electrically insulated along a topside of the shell by a layer of tape.

12. The electronic device of claim 11 wherein the tape is polyimide tape.

13. The electronic device of claim 11 wherein the at least one finger is formed of phosphor bronze.

14. The electronic device of claim 13 wherein the shell is formed using stainless steel.

15. The electronic device of claim 9 wherein electromagnetic interference suppression circuits are electrically located between the shell and the at least one finger.

16. A method of routing grounds comprising:
providing a signal ground path comprising a faceplate of a receptacle, a shell of the receptacle, a first contact of the receptacle, and a first trace on a main-logic board, wherein the faceplate of the receptacle, the shell of the receptacle, the first contact of the receptacle, and the first trace on the main-logic board are electrically connected; and
providing an enclosure ground comprising a device enclosure, at least one finger of the receptacle, and a second trace on the main-logic board, wherein the device enclosure, the at least one finger, and the second trace on the main-logic board are electrically connected,
wherein the signal ground path and the enclosure ground are electrically isolated.

17. The method of claim 16 further comprising providing electrostatic discharge and electromagnetic interference circuitry between the first trace and the second trace on the main-logic board.

18. The method of claim 17 wherein the at least one finger of the receptacle passes through an opening in the shell of the receptacle.

19. The method of claim 16 wherein a tab of the shell of the receptacle is soldered to the first trace on the main-logic board.

20. The method of claim 16 wherein the at least one finger of the receptacle is soldered to the second trace on the main-logic board.

21. The connector receptacle of claim 1 wherein the second side is a bottom side.

22. The connector receptacle of claim 21 wherein at least one finger comprises a first portion angled along the top side of the shell.

23. The electronic device of claim 9 wherein the second side is a bottom side.

24. The electronic device of claim 23 wherein at least one finger comprises a first portion angled along the top side of the shell.

25. The connector receptacle of claim 1 further comprising a first contact, the first contact electrically connected to the shell.

26. The electronic device of claim 9 further comprising a first contact, the first contact electrically connected to the shell.

\* \* \* \* \*